United States Patent
Hung et al.

(10) Patent No.: US 9,570,186 B2
(45) Date of Patent: Feb. 14, 2017

(54) MEMORY PAGE BUFFER

(71) Applicant: MACRONIX INTERNATIONAL CO., LTD., Hsinchu (TW)

(72) Inventors: Chun-Hsiung Hung, Hsinchu (TW); Chi Lo, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 14/853,583

(22) Filed: Sep. 14, 2015

(65) Prior Publication Data
US 2016/0005481 A1  Jan. 7, 2016

Related U.S. Application Data

(62) Division of application No. 13/871,891, filed on Apr. 26, 2013, now Pat. No. 9,147,485, which is a division of application No. 13/101,753, filed on May 5, 2011, now Pat. No. 8,432,746.

(51) Int. Cl.
*G11C 16/04* (2006.01)
*G11C 16/26* (2006.01)
*G11C 16/06* (2006.01)
*G11C 16/28* (2006.01)
*G11C 11/56* (2006.01)
*G11C 16/10* (2006.01)

(52) U.S. Cl.
CPC ............ *G11C 16/26* (2013.01); *G11C 11/56* (2013.01); *G11C 16/0483* (2013.01); *G11C 16/06* (2013.01); *G11C 16/10* (2013.01); *G11C 16/28* (2013.01); *Y10T 29/49117* (2015.01)

(58) Field of Classification Search
USPC .......... 365/185.05, 185.17, 189.15, 207, 205
See application file for complete search history.

(56) References Cited

U.S. PATENT DOCUMENTS

| | | | |
|---|---|---|---|
| 5,841,693 A * | 11/1998 | Tsukiji | G11C 11/5621 257/315 |
| 5,862,074 A | 1/1999 | Park | |
| 7,050,346 B2 | 5/2006 | Maejima et al. | |
| 7,081,377 B2 | 7/2006 | Cleeves | |
| 8,432,746 B2 | 4/2013 | Hung et al. | |
| 9,147,485 B2 | 9/2015 | Hung et al. | |
| 2002/0186591 A1 | 12/2002 | Lee et al. | |
| 2009/0141556 A1 | 6/2009 | Baik | |

(Continued)

OTHER PUBLICATIONS

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

(Continued)

*Primary Examiner* — Vu Le
(74) *Attorney, Agent, or Firm* — Haynes Beffel & Wolfeld LLP

(57) ABSTRACT

Various embodiments address various difficulties with source side sensing difficulties in various memory architectures, such as 3D vertical gate flash and multilevel cell memory. One such difficulty is that with source side sensing, the signal amplitude is significantly smaller than drain side sensing. Another such difficulty is the noise and reduced sensing margins associated with multilevel cell memory. In some embodiments the bit line is selectively discharged prior to applying the read bias arrangement.

8 Claims, 13 Drawing Sheets

(56) References Cited

U.S. PATENT DOCUMENTS

2010/0172181 A1 7/2010 Murakami
2010/0270593 A1 10/2010 Lung et al.
2011/0038197 A1 2/2011 Seol et al.

OTHER PUBLICATIONS

Jung et al., "Three Dimensionally Stacked NAND Flash Memory Technology Using Stacking Single Crystal Si Layers on ILD and TANOS Structure for Beyond 30nm Node," Electron Devices Meeting, 2006 IEDM '06 International Dec. 11-13, 2006, pp. 1-4.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," IEEE Int'l Electron Devices Meeting, Dec. 11-13, 2006, 4 pages.

Tanaka et al., "Bit Cost Scalable Technology With Punch and Plug Process for Ultra High Density Flash Memory," 2007 IEEE Symposium on VLSI Technology Digest of Technical Papers, Jun. 12-14, 2007, pp. 14-15.

* cited by examiner

MEMORY PAGE BUFFER

PRIORITY APPLICATIONS

This application is a divisional of U.S. patent application Ser. No. 13/871,891, filed 26 Apr. 2013 entitled Memory Page Buffer (now U.S. Pat. No. 9,147,485; which is a divisional of U.S. patent application Ser. No. 13/101,753, filed 5 May 2011 entitled Memory Page Buffer know U.S. Pat. No. 8,432,746) and is related to U.S. patent application Ser. No. 12/011,717 filed 21 Jan. 2011 (U.S. Patent Publication No. 2008/0246696). All applications are incorporated herein by reference.

BACKGROUND

Field of the Invention

This technology relates to data sensing in a memory.

Description of Related Art

Noise results from high bit line current during a read operation. Such noise causes reduced sensing margins or even sensing failure.

Particularly with multi level cell memory architectures that store multiple bits per physical memory location, the large difference between a large magnitude gate voltage—positioned between larger magnitude threshold voltage distributions—tends to cause such high bit line current.

SUMMARY

Various embodiments address various difficulties with source side sensing difficulties in various memory architectures, such as 3D vertical gate flash and multilevel cell memory. One such difficulty is that with source side sensing, the signal amplitude is significantly smaller than drain side sensing. Another such difficulty is the noise and reduced sensing margins associated with multilevel cell memory.

One aspect of the technology is a memory method. The method has one or more steps, including the following:

The step is responsive to a second read instruction to perform a read operation on a second memory cell coupled to a bit line. The second read instruction is after a first read instruction. The first read instruction is to perform the read operation on a first memory cell coupled to the bit line. The step includes, performing one or more steps, including the following:

The step of applying a read bias arrangement to the second memory cell without discharging the bit line prior to applying the read bias arrangement. In one embodiment, the read bias arrangement reads a data value on the second memory cell based on whether current flows from a source line of the second memory cell to the bit line coupled to the second memory cell.

In one embodiment the first memory cell has a threshold voltage in a low magnitude threshold voltage distribution of a plurality of selectable threshold voltage distributions.

In one embodiment the read bias arrangement causes the current to flow through a diode between the source line and the bit line. The diode prevents the current from flowing from the bit line to the source line.

In one embodiment, the first memory cell and the second memory cell are included in a 3D memory array.

In one embodiment, the first memory cell and the second memory cell are included in a multilevel cell memory array. In a multilevel cell memory array, a particular memory material location stores more than 1 bit.

One embodiment includes, responsive to the second read instruction, further performing: prior to applying the read bias arrangement, precharging the bit line.

One embodiment includes, responsive to the second read instruction, further performing: prior to applying the read bias arrangement, precharging the bit line sufficiently, such that responsive to the second memory cell having a threshold voltage in a low magnitude threshold voltage distribution of a plurality of selectable threshold voltage distributions, the current fails to flow responsive to applying the read bias arrangement to the second memory cell.

One embodiment includes, responsive to the second read instruction, further performing: applying a sequence of increasingly larger magnitude voltages to a gate of the second memory cell.

One embodiment includes, responsive to the second read instruction, further performing: applying a sequence of increasingly larger magnitude gate voltages to a gate of the second memory cell. This applying step includes: responsive to a previous gate voltage of the sequence causing the current indicating that the data value on the second memory cell corresponds to no threshold voltage distribution having magnitudes lower than a magnitude of the previous gate voltage, applying a next gate voltage of the sequence to the gate of the second memory cell.

In one embodiment, the read bias arrangement reads the data value with a differential sense amplifier.

Another aspect of the technology is a memory device. The memory device includes a plurality of memory cells, a plurality of bit lines coupled to the memory cells, a plurality of source lines coupled to the memory cells, and control circuitry.

The plurality of memory cells includes a first memory cell and a second memory cell. The plurality of bit lines includes a bit line coupled to the first memory cell and the second memory cell. The plurality of source lines includes a source line coupled to the second memory cell.

The control circuitry is responsive to a second read instruction to perform a read operation on the second memory cell after a first read instruction to perform the read operation on the first memory cell. The control circuitry is responsive, by performing the following:

The control circuitry applies a read bias arrangement to the second memory cell without discharging the bit line prior to applying the read bias arrangement. In one embodiment, the read bias arrangement reads a data value on the second memory cell based on whether current flows from the source line coupled to the second memory cell to the bit line coupled to the second memory cell.

In one embodiment, the first memory cell has a threshold voltage in a low magnitude threshold voltage distribution of a plurality of selectable threshold voltage distributions.

In one embodiment, the read bias arrangement causes the current to flow through a diode between the source line and the bit line. The diode prevents the current from flowing from the bit line to the source line.

In one embodiment, the first memory cell and the second memory cell are included in a 3D memory array.

In one embodiment, the first memory cell and the second memory cell are included in a multilevel cell memory array.

In one embodiment, the control circuitry, responsive to the second read instruction, further performs the following: prior to applying the read bias arrangement, precharging the bit line.

In one embodiment, the control circuitry, responsive to the second read instruction, further performs the following: prior to applying the read bias arrangement, precharging the bit line sufficiently, such that responsive to the second memory cell having a threshold voltage in a low magnitude threshold voltage distribution of a plurality of selectable threshold voltage distributions, the current fails to flow responsive to applying the read bias arrangement to the second memory cell.

In one embodiment, the control circuitry, responsive to the second read instruction, further performs the following: applying a sequence of increasingly larger magnitude voltages to a gate of the second memory cell.

In one embodiment, the control circuitry, responsive to the second read instruction, further performs the following: applying a sequence of increasingly larger magnitude gate voltages to a gate of the second memory cell. Such applying includes: responsive to a previous gate voltage of the sequence causing the current indicating that the data value on the second memory cell corresponds to no threshold voltage distribution having magnitudes lower than a magnitude of the previous gate voltage, applying a next gate voltage of the sequence to the gate of the second memory cell.

One embodiment further comprises a differential sense amplifier that reads the data value.

Another aspect is a page buffer circuit, comprising a differential sense amplifier and a page buffer logic circuit. The differential sense amplifier includes a memory element with a previously sensed logic state. The page buffer logic circuit is coupled to the memory element of the differential sense amplifier.

In one embodiment, the differential sense amplifier senses the logic state of memory cells having one of at least a low threshold voltage state and a high threshold voltage state, and the page buffer logic circuit receives as input the previously sensed logic state, wherein responsive to the previously sensed logic state corresponding to the low threshold voltage state, the page buffer logic circuit allows a read operation to proceed on a memory cell without discharging a bit line coupled to the memory cell.

Yet another aspect of the technology is a method of manufacturing a memory device as described herein.

DETAILED DESCRIPTION

Figure 1:
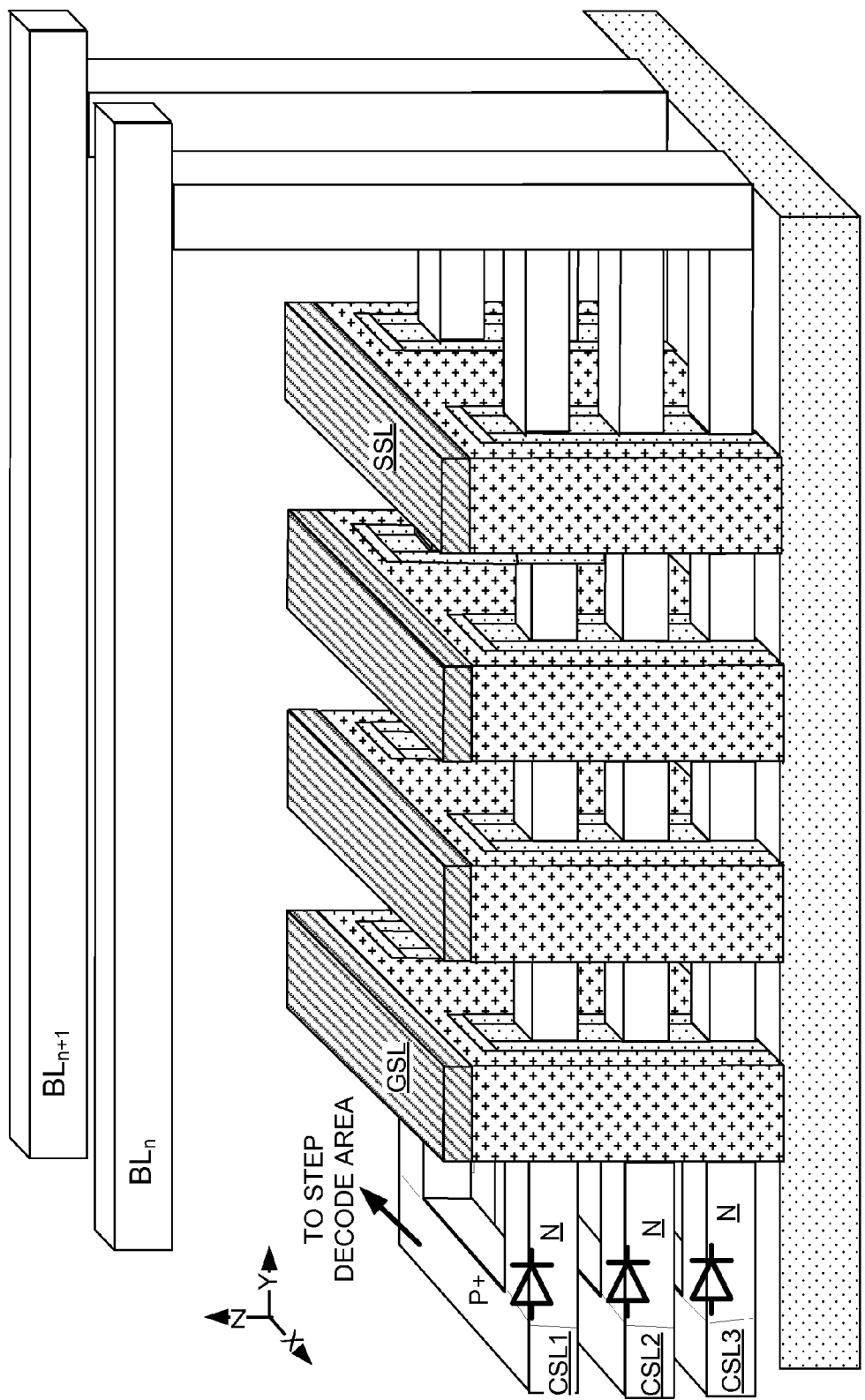
FIG. 1 is a perspective view of a 3D NAND-flash memory structure including diodes in the strings between the source line structures and the memory strings.

FIG. 1 illustrates a 3D NAND-flash memory structure including diodes positioned on the common source line end of the strings of memory cells. Thus, the source lines in each plane are coupled together by a P+ line or implants, forming PN diodes on each string of lines between the common source line decoder and the ground select line GSL.

The diodes are in the semiconductor bodies of the NAND strings. The structure includes a plurality of ridge shaped stacks including the semiconductor material strips in respective planes of the ridge shaped stacks on a substrate. A plurality of conductive lines (only two are shown for simplicity in this diagram) act as word lines which extend orthogonally across the stacks, and are conformal over memory layers. Another conductive line acts as a string select lines (SSL) and yet another conductive line acts as a common source select line (GSL), and such conductive lines are arranged parallel to the plurality of conductive lines acting as word lines. These conductive lines are formed by conductive material, such as polysilicon having n-type or p-type doping, to be used for the conductive lines which act as word lines. Silicide layers can overlie the tops of the conductive lines acting as word lines, string select lines and common source select lines.

The semiconductor material strips are connected to the other semiconductor material strips in the same planes by common source line interconnections, and to a plane decoder (not shown). The semiconductor material strips are extended in the common source line interconnections using a stepped contacting area.

Diodes are placed between the memory cells coupled to the word lines and plugs which couple the semiconductor material strips to bit lines. In the illustrated example, the diodes are formed by a P+ implant region in the semiconductor material strips. Plugs can comprise doped polysilicon, tungsten or other vertical interconnect technologies. Overlying bit lines are connected between the plugs and column decoding circuitry (not shown). SLs source lines of each layer are separately decoded. SSL string select line/ GSL ground select line, WL's word lines, and BL's bit lines are common vertically for the multilayer stacks.

In the shown structure, no contacts need to be formed in the array to the string select gates and common source select gates.

FIG. 1 illustrates an implementation in which the diodes are positioned on the common source line end of the strings of memory cells. Thus, in the common source line CSL1/

CSL2/CSL3 region the source lines in each plane are coupled together by a P+ line or implants, forming PN diodes on each string of lines between the common source line decoder and the ground select line GSL. Various embodiments of the structure of FIG. 1 employ source-side (source line), reverse read sensing. In various embodiments, the diodes suppress stray current paths during read and program inhibit operations.

Figure 2:
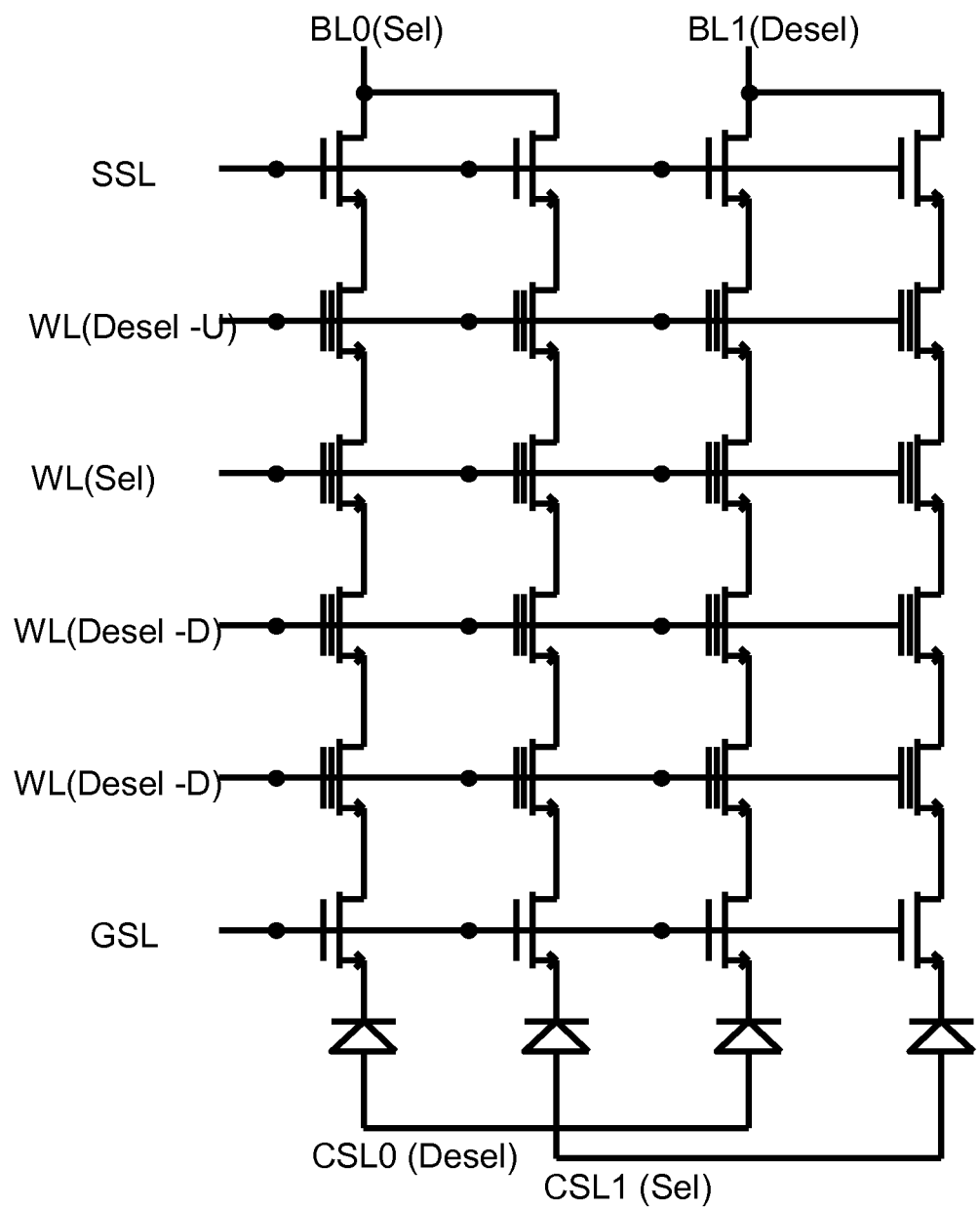
FIG. 2 is a schematic diagram of a 3D NAND-flash memory structure including diodes in the strings between the source line structures and the memory strings, showing 2 planes of memory cells.

FIG. 2 is a schematic diagram of a 3D NAND-flash memory structure including diodes in the strings between the source line structures and the memory strings, showing two planes of memory cells.

The diode on the common source lines CSLs prevent current flow back to CSL during program and read operations. Because the diodes limit the current flow direction from the common source line CSL to the bit line BL, source side sensing is adopted The two planes of cells correspond to the common source line CSL0 and common source line CSL1. Two columns of cells correspond to the bit line BL0 and bit line BL1. Four rows of memory cells correspond to the word lines shown in the diagram. A string select line SSL is coupled to string select gates for the 3D structure, and a ground select line GSL is coupled to the common source of ground select gates for the 3D structure. Diodes are coupled between the common source line CSL0 and common source line CSL1, and the corresponding strings of cells.

For a NAND flash cell, Fowler Nordheim tunneling is used to program the selected cell. To inhibit programming of the deselected cell, a high-voltage should be applied to the local bit line or channel of the cells.

A discussion on terminology follows. In many cases, for drain side sensing, the common source line CSL is on the source side of the memory cell being read, and the source voltage is applied to the common source line CSL.

However, because reverse read is adopted in various embodiments, the common source line CSL is on the drain side of the memory cell being read, and the drain voltage is applied to the common source line CSL. The result is sensed on bit lines BLs, on the source voltage side of the memory cell being read.

Figure 3:
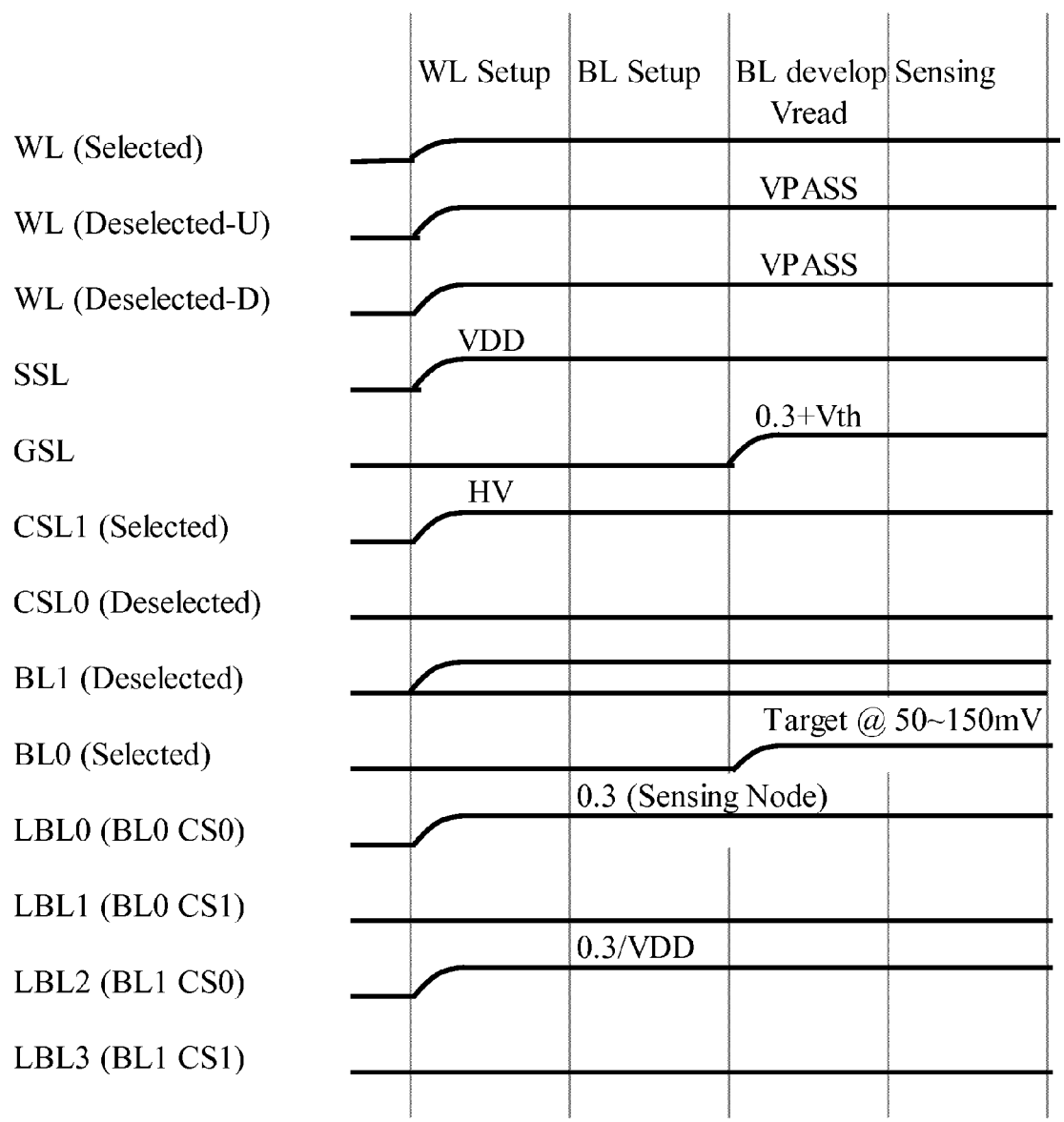
FIG. 3 is a timing diagram for a read operation in an array like that of FIG. 2.

FIG. 3 is a timing diagram for a read operation in an array like that of FIG. 2.

The drain side voltage of cells is provided from common source line CSL, through a diode, and clamped by the ground select line GSL. The CSL, Common Source Line line resistance is a serious issue. Common source line CSL voltage varies with location due to the line resistance and voltage drop across the line resistance.

Cell current flows to bit line BL, and charges the bit line BL capacitance. The bit line BL is initially ground GND, and the magnitude of how far the current charges up the capacitance, depends on the selected cell threshold voltage Vt.

After ground select line GSL enable, for low threshold voltage Vt cells, the bit line BL will charge up to 100 mV or so. For high threshold voltage Vt cells, the bit line BL remain ground GND.

Figure 4:
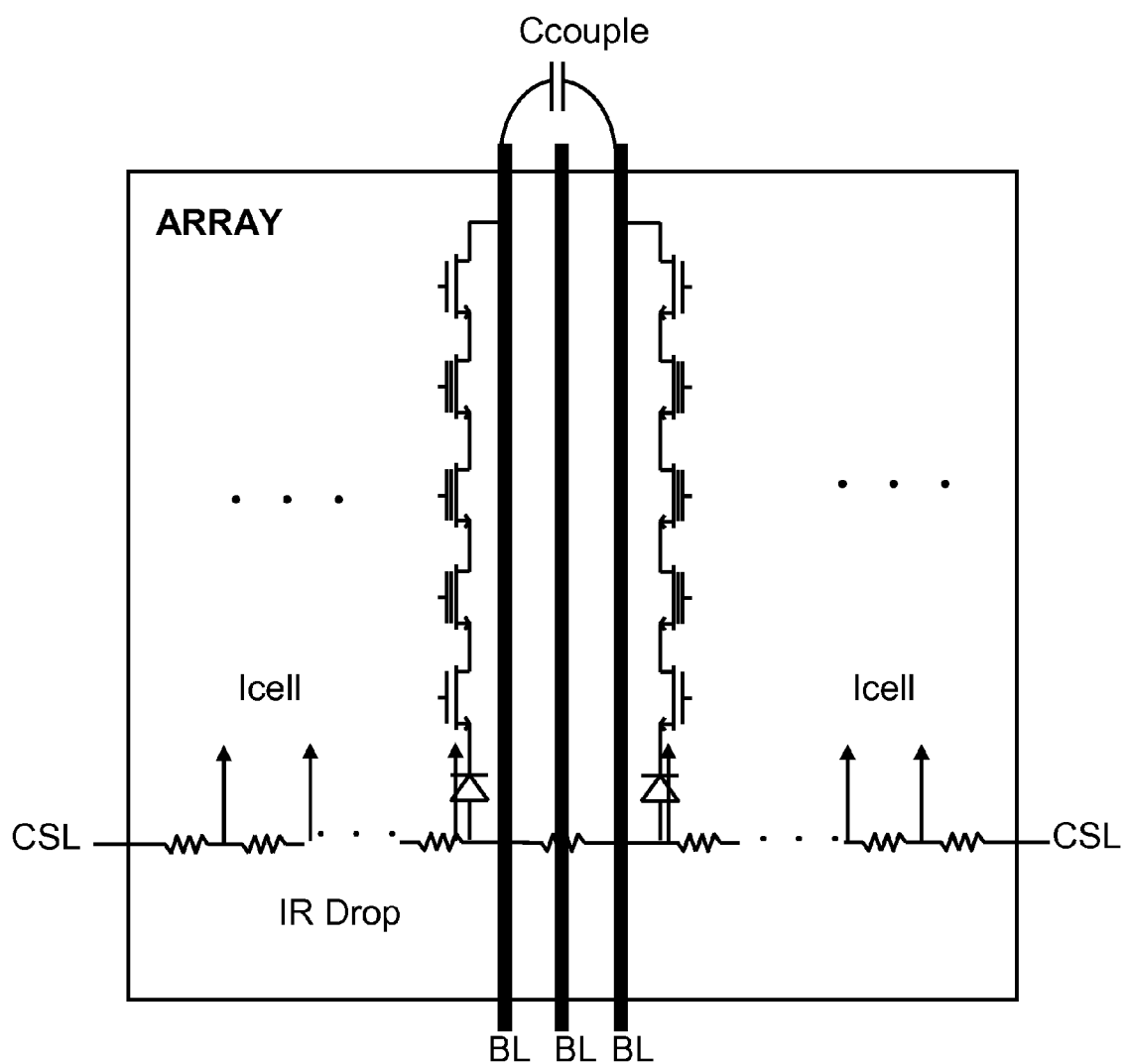
FIG. 4 is a circuit schematic showing issues with a 3D memory.

FIG. 4 is a circuit schematic showing issues with a 3D memory.

Shown are issues of voltage drop on common source line CSL and bit line BL coupling. Large cell current is generated due to the high overdrive of memory cells (Vgs-Vt, gate to source voltage difference minus threshold voltage) when reading low threshold voltage Vt cells with high gate voltage VG. The cell current flows on the common source line CSL, and results in a high voltage drop (I*R current*resistance drop) along the common source line CSL path. The figure indicates multiple NAND strings to either side of the bit lines with the three dots to either side of the bit lines. Each of the vertical arrows indicates current flow through another such NAND string.

High cell current induces selected bit line BL fast-charge-up, which couples next selected bit lines. This noise reduces the sensing margin, and even causes sensing failure.

In one embodiment, when even-bit lines BLs are sensing, odd-bit lines BLs couple to ground GND to avoid the coupling effect. However there is still even-bit line BL to even-bit line BL coupling which causes read window loss or even read fail.

Multi-level cell MLC memory sensing suffers more serious even-bit line BL to even-bit line BL (or odd-bit line BL to odd-bit line BL) coupling, especially when reading very low threshold voltage Vt cells with high word line WL voltage. Embodiments of the page buffer with a read sequence, from low word line WL voltage to high word line WL voltage, reduce bit line BL coupling and common source line CSL noise for source side sensing.

Figure 5:
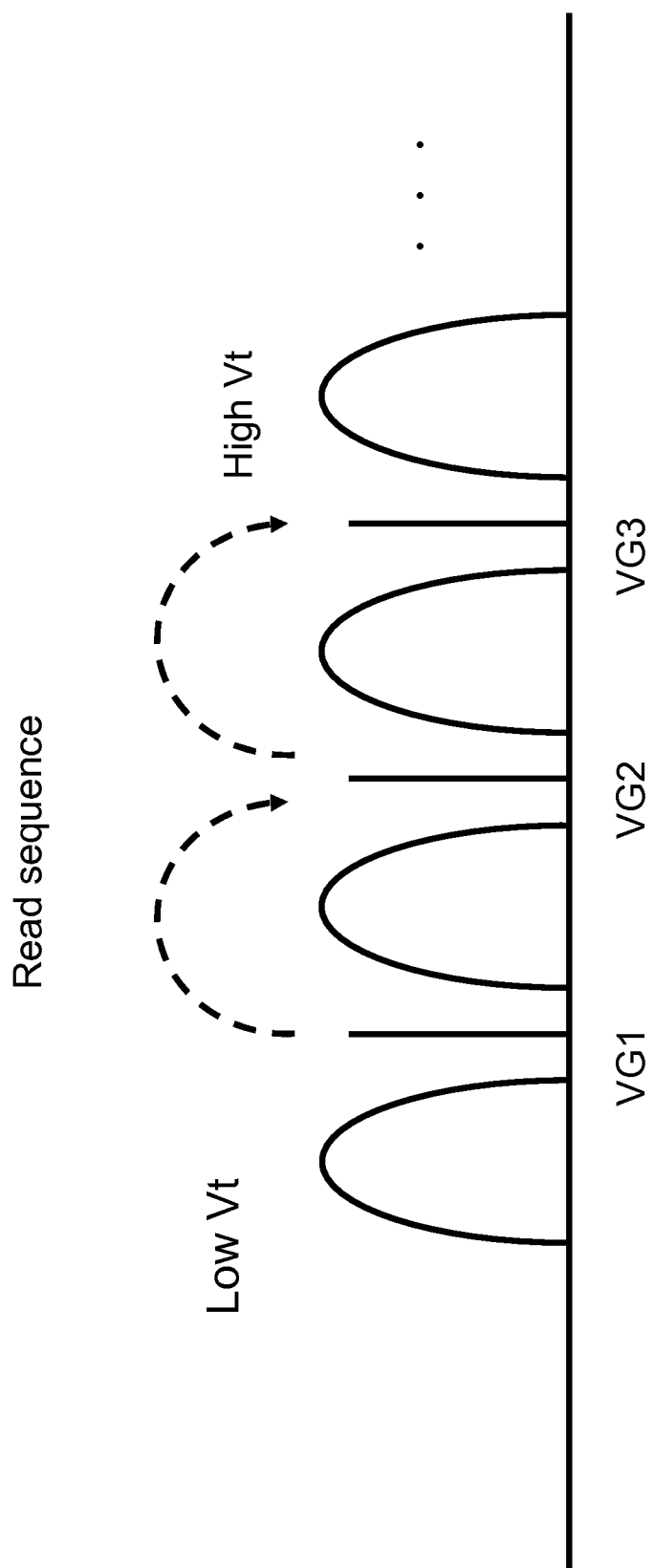
FIG. 5 is a graph of threshold voltage showing threshold voltage distributions and intervening word line threshold voltages.

FIG. 5 is a graph of threshold voltage showing threshold voltage distributions and intervening word line threshold voltages. Shown is the read sequence—from low to high threshold voltage Vt, to reduce read "1" current.

In order to reduce high cell current when reading low threshold voltage Vt cells with high gate voltage VG, the scheme is as follows:

Read cells from low to high threshold voltage Vt.

Once the sense amplifier sensing data equals "H", indicating sensing of a low threshold voltage Vt cell, record it in the latch.

For the next gate voltage VG read, charge bit line BL to "H" instead of discharging to ground GND if previous sensing data equaled "H".

Because the bit line BL charges up to "H", there is no cell current such as bit line charging current (gate to source voltage Vgs<0). Thus, it cuts down large amount of current from CSL and alleviates the I*R drop.

One or more of the aforementioned problems, related to sensing difficulties in 3D vertical gate flash such as source side sensing, are addressed by embodiments of a page buffer circuit.

Due to source side sensing, the signal amplitude is significantly smaller than drain side sensing. The small sensing signal and BL coupling makes sensing more critical. Also, because thousands of page buffers are enabled together during read, large cell current is introduced on the common source line CSL, the drain side of the cells. Large voltage drop results on the common source line CSL, especially when reading low threshold voltage Vt cells with high gate voltage VG.

A latch based differential sense amplifier senses 50 mV difference. The page buffer circuit precharges bit line BL if previous sensing data was "low threshold voltage Vt", greatly reducing read "1" current and reducing bit line BL coupling noise and voltage drop along the common source line CSL.

The following page buffer circuits and methods reduce bit line BL coupling.

Figure 6:
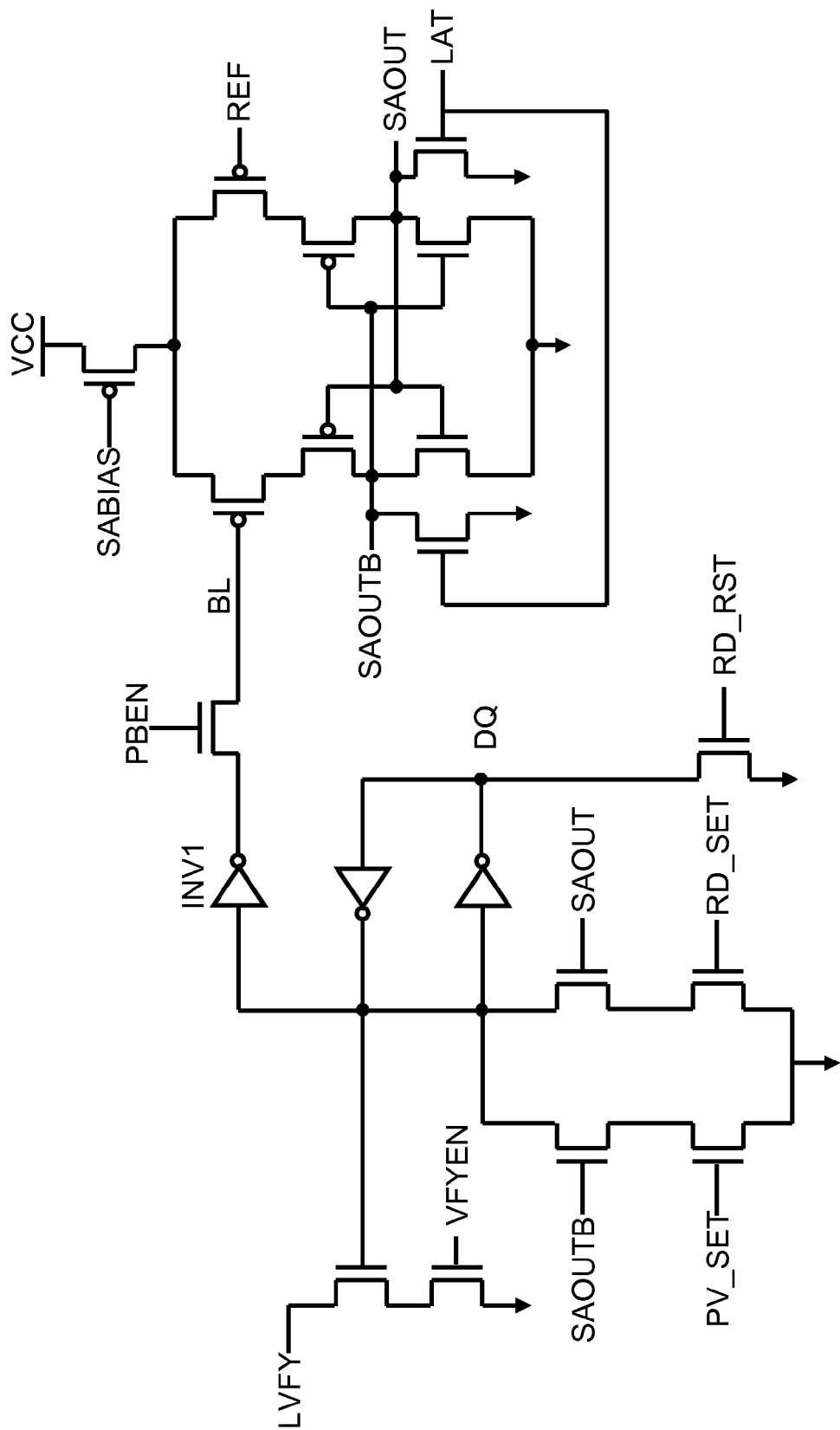
FIG. 6 is a circuit diagram of a first embodiment of a page buffer circuit.

FIG. 6 is a circuit diagram of a first embodiment of a page buffer circuit. The page buffer circuit includes a low voltage sense amplifier and a page buffer logic circuit. Details are shown in further figures and discussion.

Figure 7:
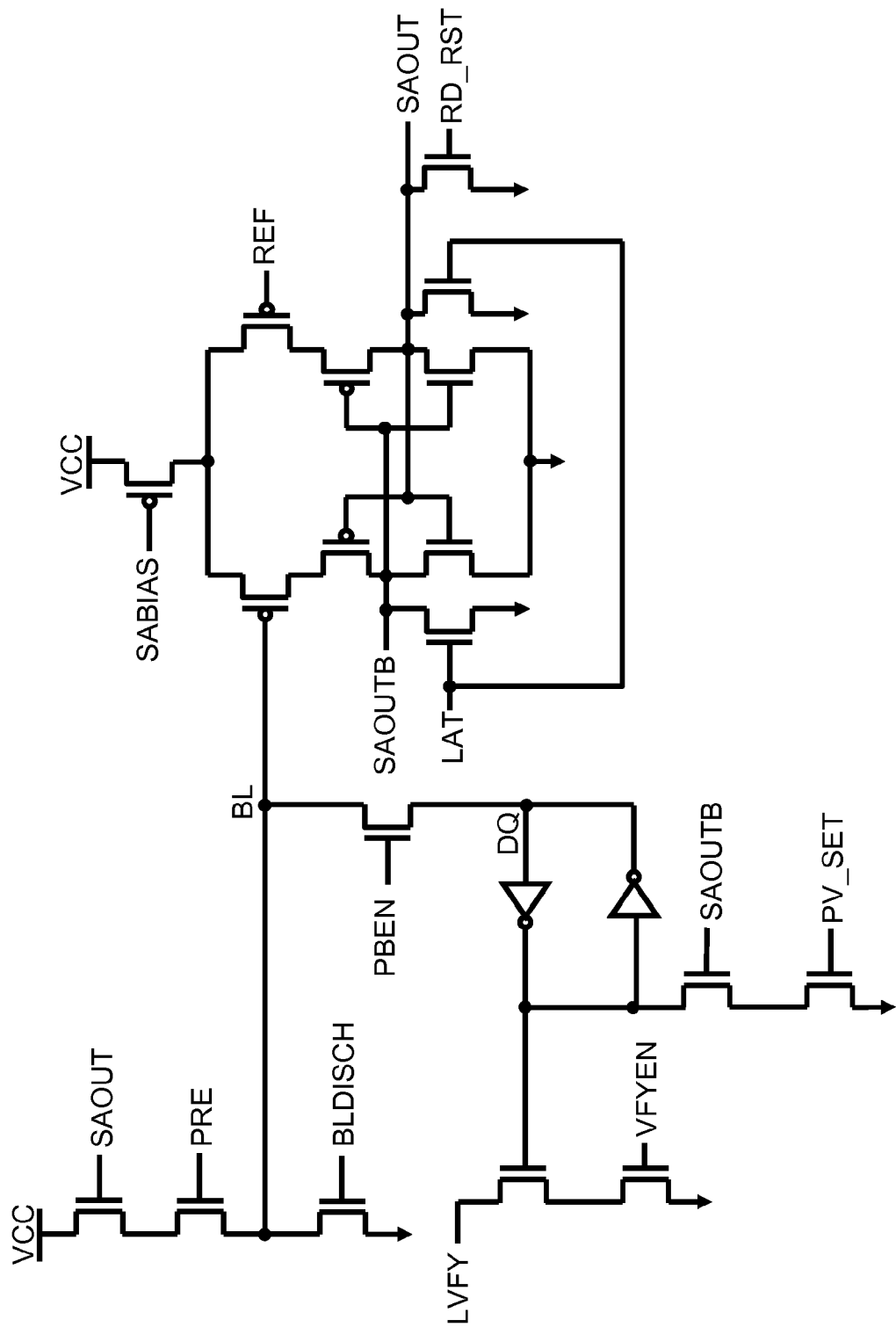
FIG. 7 is a circuit diagram of a second embodiment of a page buffer circuit.

FIG. 7 is a circuit diagram of a second embodiment of a page buffer circuit. The page buffer circuit again includes a low voltage sense amplifier and a page buffer logic circuit. Details are shown in further figures and discussion.

Figure 8:
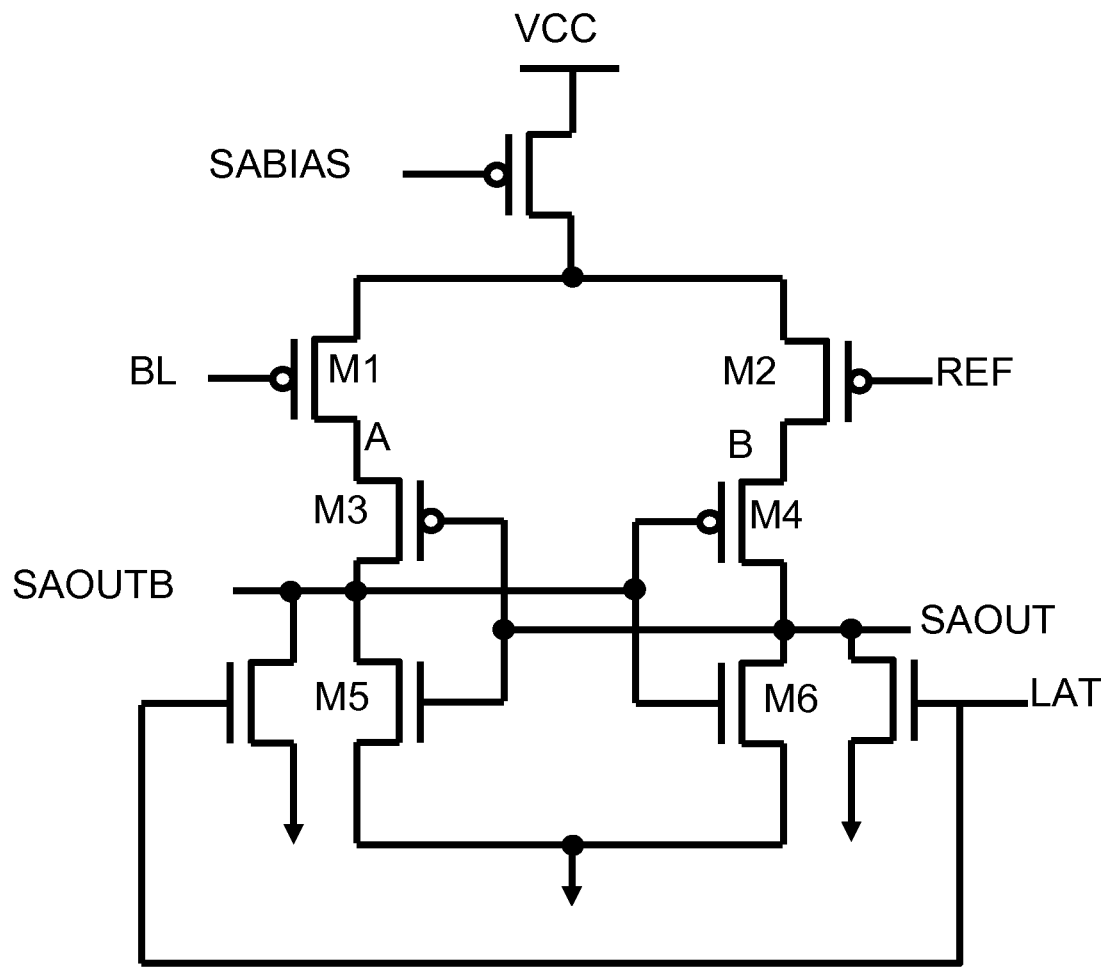
FIG. 8 is a circuit diagram of a low voltage sensing sense amplifier shown in FIGS. 6 and 7.

FIG. 8 is a circuit diagram of a low voltage sensing sense amplifier. The sense amplifier of FIG. 8 is included in the page buffer embodiments shown in FIGS. 6 and 7.

The low voltage sensing sense amplifier performs differential sensing.

The sensing node BL is around 100 mV when sensing cells storing "1". The sensing node BL is around 0V when sensing cells storing "0".

The reference REF comes from a stable voltage source and set to 50 mV.

At first, latch LAT=0 sense amplifier SA latch previous data by M3~M6

After bit line BL development, the voltage difference between BL and REF is large enough—50 mV or so—and then the LAT pulse discharges the sense amplifier nodes SAOUT and SAOUTB (trailing B is for bar, two inputs for differential input).

As latch LAT goes high, nodes A, B, SAOUT, SAOUTB quickly develop and latch the corresponding data due to the different overdrive of p-type transistor PMOS, gate to source voltage Vgs of M1 and M2.

Figure 9:
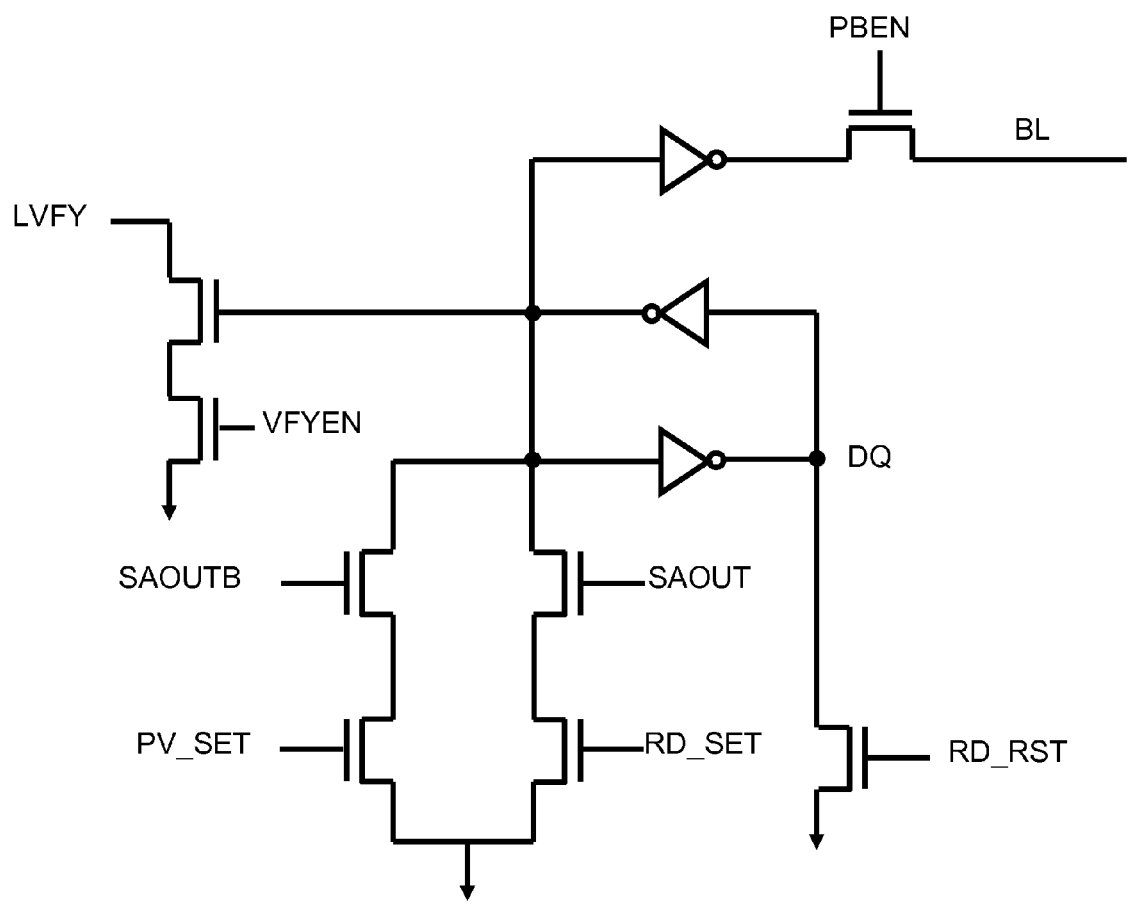
FIG. 9 is a circuit diagram of a page buffer logic circuit in the first embodiment of the page buffer circuit shown in FIG. 6.

FIG. 9 is a circuit diagram of a page buffer logic circuit in the first embodiment of the page buffer circuit shown in FIG. 6.

An MLC (multilevel cell) read operation performs the following:

In the beginning, read reset RD_RESET asserts to reset data data DQ=L.

If SAOUT=H, which means low threshold voltage Vt, data DQ is set to H.

For the next gate voltage VG read, bit line BL precharges to H if data DQ=H.

SAOUT is always sensing H after bit line BL precharges to H.

A program verify operation performs the following:

If a cell id programmed to high threshold voltage Vt, SAOUTB=H and set data DQ=H during the program verify set PV SET assertion period.

In program phase, if data DQ=H, bit line BL charges to H and then program inhibit follows.

Or circuit determines verify pass or fail. When all data DQ=H, program verify pass follows.

Figure 10:
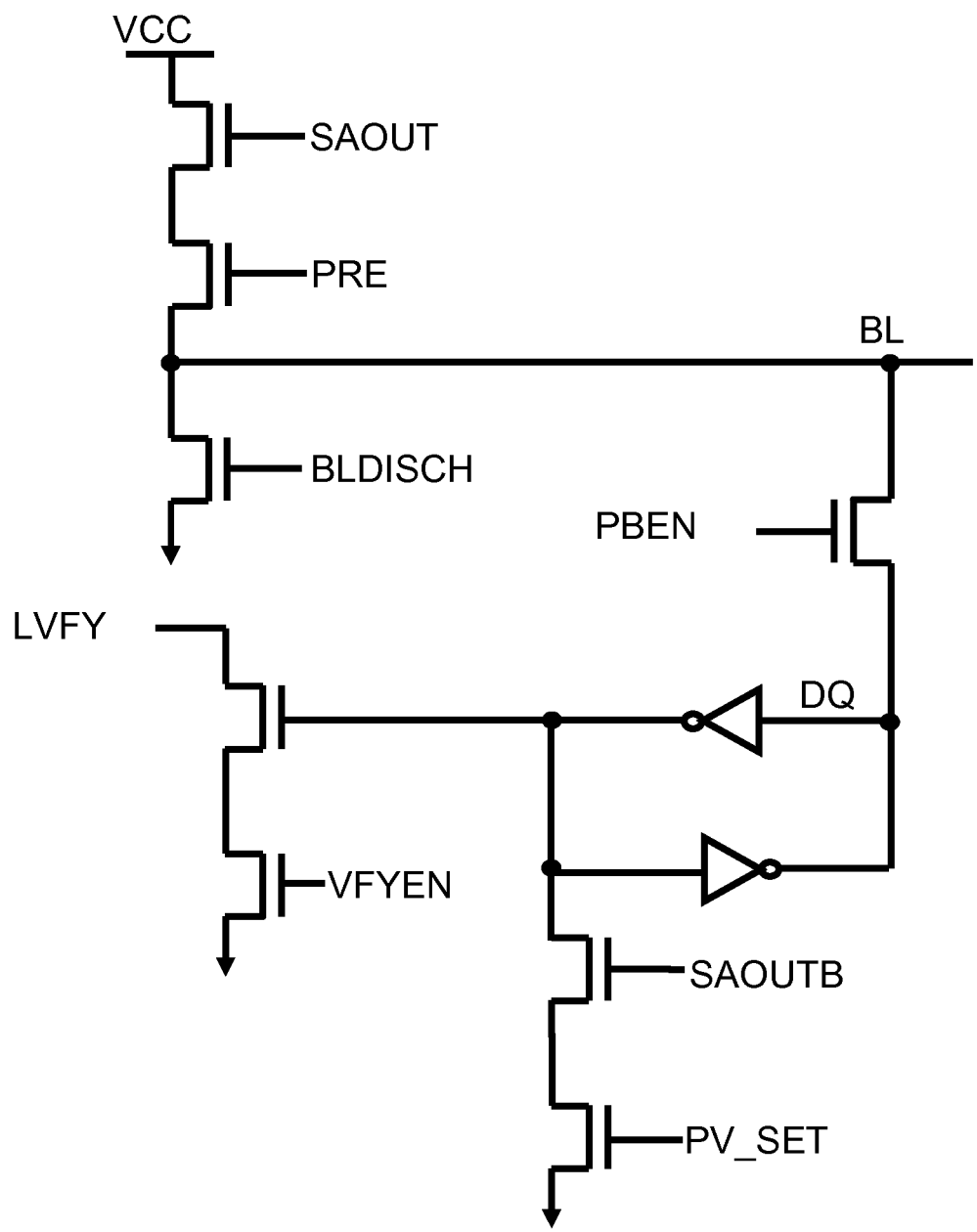
FIG. 10 is a circuit diagram of a page buffer logic circuit in the second embodiment of the page buffer circuit shown in FIG. 7.

FIG. 10 is a circuit diagram of a page buffer logic circuit in the second embodiment of the page buffer circuit shown in FIG. 7.

An MLC read operation performs the following:

Bit line discharge BLDISCH discharges bit line BL to ground GND.

Next, precharge PRE enables and bit line BL precharges back to H if SAOUT=H.

SAOUT is set to L at the beginning of read operation.

A program verify operation performs the following:

If memory cell is programmed to high threshold voltage Vt, SAOUTB=H and sets data DQ=H during program verify PV SET assertion period.

In program phase, page buffer enable PBEN is enabled and if data DQ=H, bit line BL charges to H and then program inhibits Or circuit determines verify pass or fail. When all data DQ=H, program verify pass follows.

Other embodiments include different page buffer logic that also precharge the bit line BL voltage based on previous sensing data.

For example, the precharge bit line BL voltage is not limited to n-type transistors such as NMOS on the precharge bit line BL path, which can use as replacements or complements any other voltage control devices like p-type transistors such as PMOS, and inverter(s).

In alternative embodiments, the latch circuit is a simple inverter latch or a decode power control latch. Some embodiments of NAND flash have a large number of page buffers. In order to avoid huge amount of crossbar current while latching data, all the latches are not enabled at the same time. The decode power control latch achieves this by enabling latches in different time intervals.

Alternative embodiments avoid bit line BL coupling by precharging bit lines BL in source side sensing, and by discharging bit lines BL based on previous data in drain side sensing.

A drain side sensing embodiment performs: (1) precharge bit lines BLs (drain side of cells) (2) then discharge bit lines BLs by cell current (if cells are low threshold voltage Vt). Traditional page buffer techniques use drain side sensing, and cannot be adopted in source side sensing embodiments, because of the requirements of a read operation or a program verify operation.

A source side sensing embodiment of 3D VG NAND performs: (1) discharge bit lines BLs (source side of cells) (2) then charge up bit lines BLs by cell current (if cells are low threshold voltage Vt).

Various embodiments reduce bit line BL coupling during the charging or discharging of bit lines BL with cell current. BL coupling tends to occur when sensing low threshold voltage Vt memory cells. Once low threshold voltage Vt cells are sensed, bit lines BLs are not pre-charged or discharged for the next read operation to reduce bit line BL coupling.

Other embodiments include one or more functions such as fail bit/byte count, MLC data decode, and redundancy info.

Figure 11:
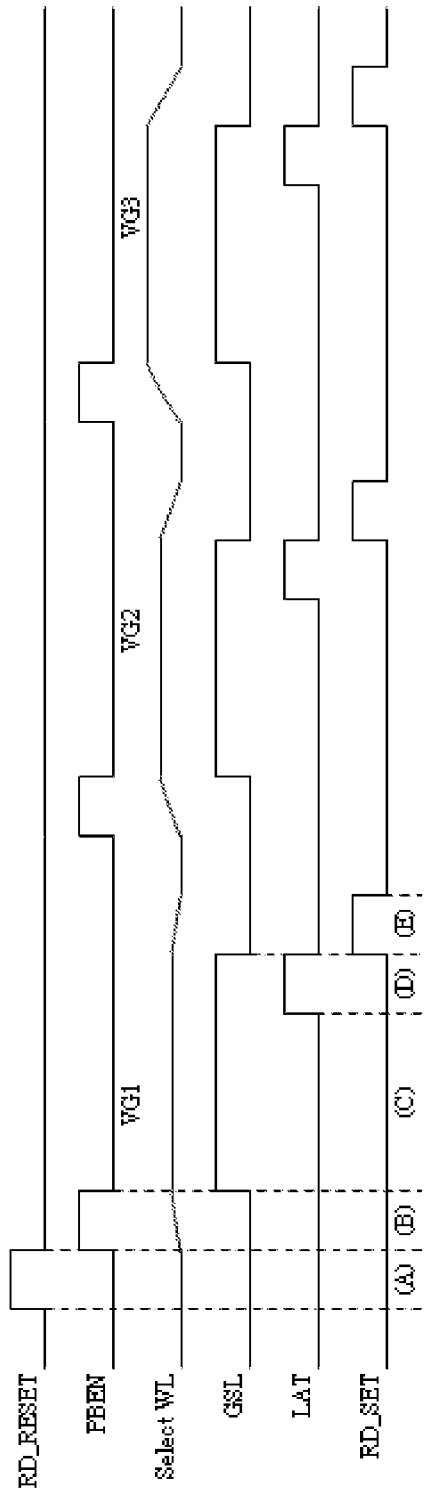
FIG. 11 is a timing diagram of a multi-level cell read operation with the first embodiment of the page buffer circuit shown in FIG. 6.

FIG. 11 is a timing diagram of a multi-level cell read operation with the first embodiment of the page buffer circuit shown in FIG. 6.

An MLC read operation performs the following steps, referenced on the time axis with the same letter:

(A) Reset page buffer latch data DQ=0.

(B) Bit line BL discharge and word line WL setup.

(C) Ground select line GSL enable and bit line BL develop.

(D) Sense amplifier SA develop and sense.

(E) Store sensing data in page buffer latch. If sensing data equals 1, set data DQ=1; when VG2 reads, charge bit line BL to VCC in phase (B) to prevent bit line BL charging up by low threshold voltage Vt cells in step (C).

Figure 12:
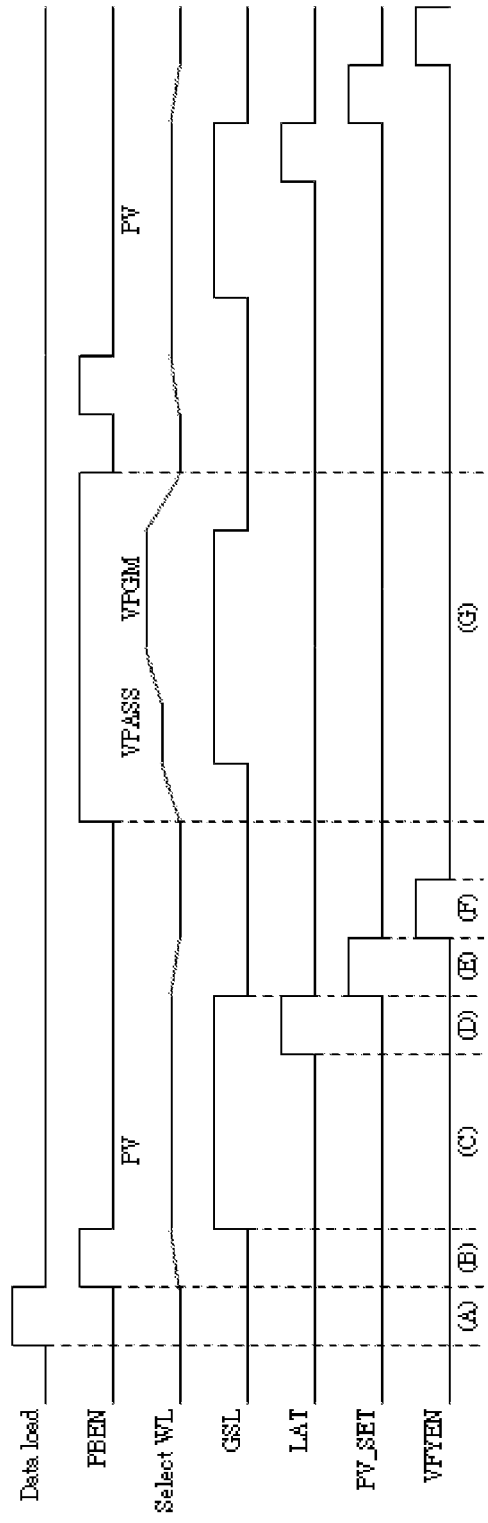
FIG. 12 is a timing diagram of a program and verify operation with the first embodiment of the page buffer circuit shown in FIG. 6.

FIG. 12 is a timing diagram of a program and verify operation with the first embodiment of the page buffer circuit shown in FIG. 6.

A program verify operation performs the following steps, referenced on the time axis with the same letter:

(A) Load program data to page buffer.

(B)~(F) Program verify process.

(B) Bit line BL discharge and word line WL setup. Page buffer enable PBEN enable. If data DQ=H, charge bit line BL to H.

(C) Ground select line GSL enable and bit line BL develop.

(D) Sense amplifier SA develop and sense.

(E) Store sensing data in page buffer latch. If sensing data equals "low threshold voltage Vt", keep data DQ=0 and do program next. If sensing data equals "high threshold voltage Vt", set data DQ=1 and stop programing this cell.

(F) Verify page buffer data.

(G) Program process.

Figure 13:
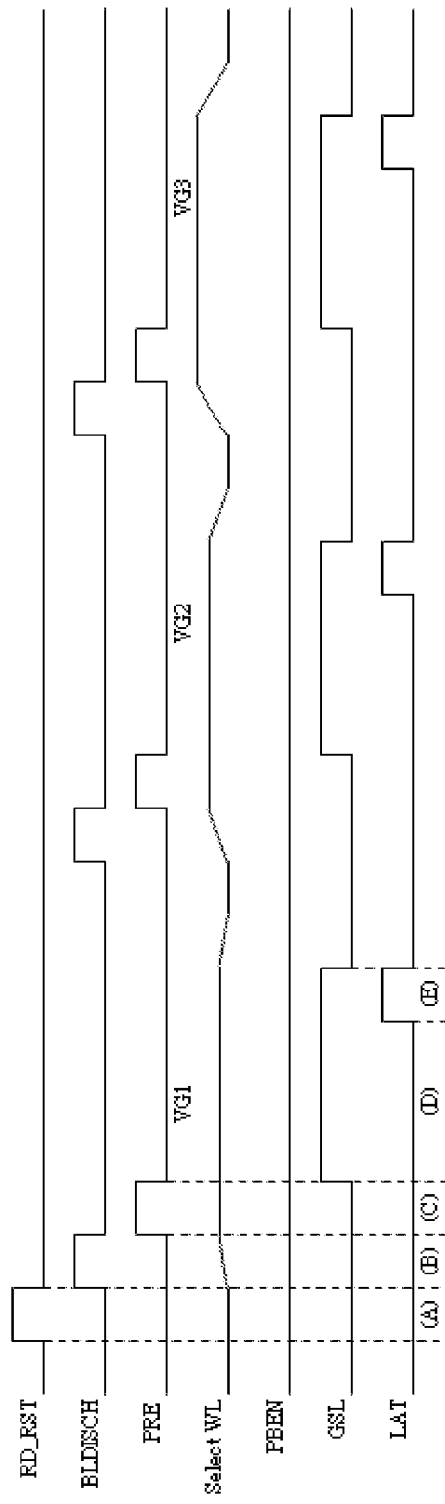
FIG. 13 is a timing diagram of a multi-level cell read operation with the second embodiment of the page buffer circuit shown in FIG. 7.

FIG. 13 is a timing diagram of a multi-level cell read operation with the second embodiment of the page buffer circuit shown in FIG. 7.

An MLC read operation performs the following steps, referenced on the time axis with the same letter:

(A) Reset SAOUT=L.

(B) Bit line BL discharge and word line WL setup.

(C) Bit line BL charging up depends on SAOUT data. If previous SAOUT=L, keep bit line BL ground GND. If previous SAOUT=H, charge bit line BL to H.

(D) Ground select line GSL enable and bit line BL develop.

(E) Sense amplifier SA develop and sense.

Figure 14:
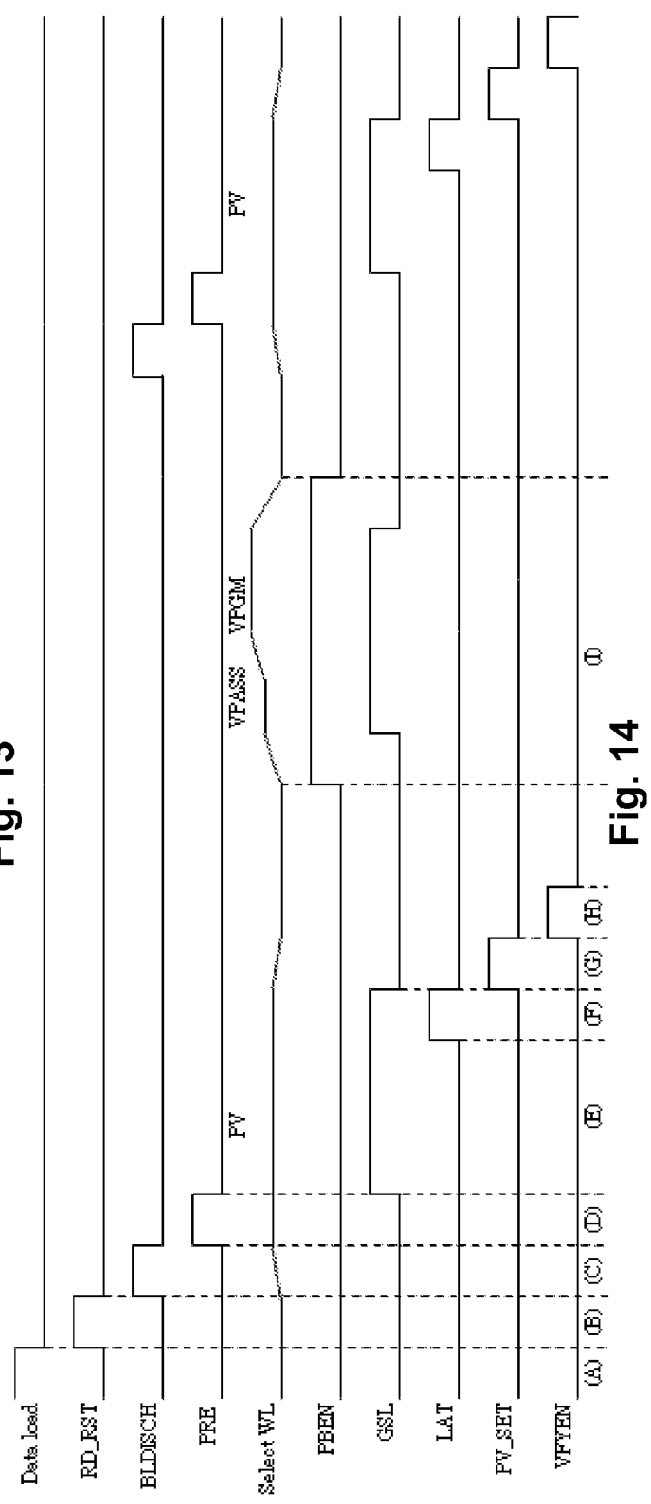
FIG. 14 is a timing diagram of a program and verify operation with the second embodiment of the page buffer circuit shown in FIG. 7.

FIG. 14 is a timing diagram of a program and verify operation with the second embodiment of the page buffer circuit shown in FIG. 7.

A program verify operation performs the following steps, referenced on the time axis with the same letter:

(A) Load program data to page buffer.

(B)~(H) Program verify process.

(B) Reset SAOUT=L.

(C) Bit line BL discharge and word line WL setup.

(D) Bit line BL charging up depends on SAOUT data.

(E) Ground select line GSL enable and bit line BL develop.

(F) Sense amplifier SA develop and sense.

(G) Store sensing data in page buffer latch. If sensing data equals "low threshold voltage Vt", keep data DQ=0 and do program next. If sensing data equals "high threshold voltage Vt", set data DQ=1 and stop programming this cell.

(H) Verify page buffer data.

(I) Program process.

Source side sensing using with SA and page buffer circuit can apply to not only 3D vertical gate flash, but also other memories generally with modifications to any drain side sensing. Generally MLC memory embodiments apply reduced read "1" cell current to avoid the coupling effect on bit line BL.

Figure 15:
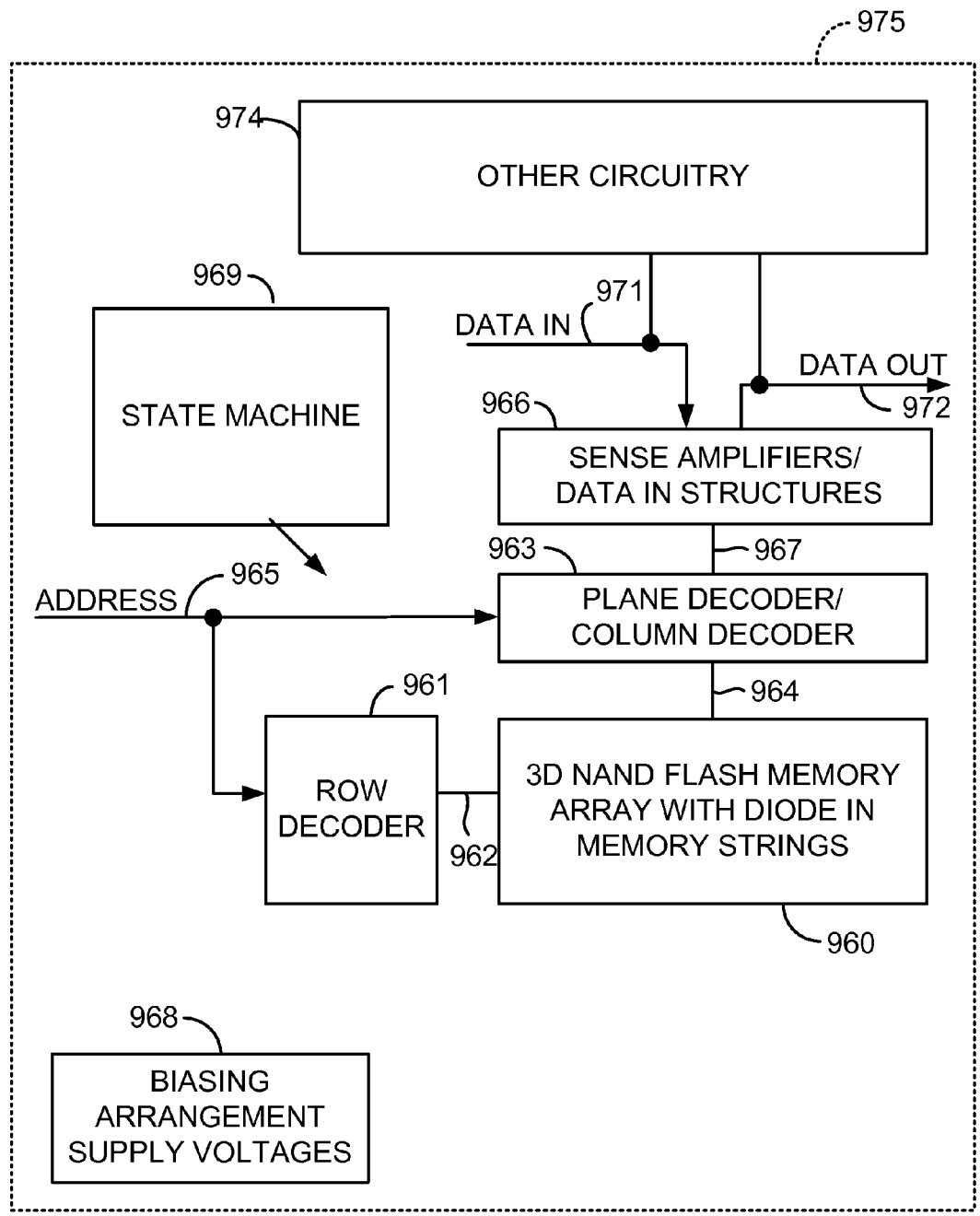
FIG. 15 is a schematic diagram of an integrated circuit including a 3D NAND-flash memory array with row, column and plane decoding circuitry.

FIG. 15 is a simplified block diagram of an integrated circuit according to an embodiment of the present invention. The integrated circuit line 975 includes a 3D NAND flash memory array 960, implemented as described herein including diodes in the local bit line paths for the memory strings, on a semiconductor substrate. A row decoder 961 is coupled to a plurality of word lines 962, and arranged along rows in the memory array 960. Circuitry 963 includes a plane decoder and a column decoder. The column decoder is coupled to a plurality of bit lines 964 (or SSL lines as described above). arranged along columns planes in the memory array 960 for reading data from the memory cells in the array 960. The plane decoder is coupled to a plurality of planes in the memory array 960 via CSL lines for programming data to the memory cells in the array 960. Addresses are supplied on bus 965 to the plane decoder and the column decoder in circuitry 963 including an improved page buffer as disclosed herein, and row decoder 961. Sense amplifiers and data-in structures in block 966 are coupled to the circuitry 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a memory having a page buffer circuit coupled to a plurality of bit lines, comprising:
    using differential sense amplifiers to sense and store a first threshold state of memory cells coupled to the plurality of bit lines as previously sensed logic states; and
    in preparation for an operation to sense a next threshold state of the memory cells coupled to the plurality of bit lines, charging bit lines in the plurality of bit lines selected based on the previously sensed logic state.

2. The method of claim 1, further comprising:
    performing drain side sensing on the plurality of bit lines.

3. The method of claim 1, further comprising:
    performing source side sensing on the plurality of bit lines.

4. The method of claim 1,
    wherein the memory comprises a NAND memory, and control circuitry enables different ones of the plurality of differential sense amplifiers at different times, when reading multiple cells of the NAND memory at a time.

5. A method of operating a memory including multiple level cells, and having a page buffer circuit coupled to a plurality of bit lines, comprising:
    first sensing threshold levels in multiple level cells coupled to the plurality of bit lines using a first gate voltage and storing the sensing result as first sensed data; and
    charging bit lines in the plurality of bit lines selected based on the first sensed data, and then second sensing threshold levels in multiple level cells coupled to uncharged bit lines in the plurality of bit lines using a second gate voltage.

6. The method of claim 5, including first programming the multiple level cells coupled to the plurality of bit lines and wherein the first sensing and second sensing are elements of a program verify operation.

7. The method of claim 5, wherein the first gate voltage is lower than the second gate voltage.

8. The method of claim 5, including using source side sensing for the first sensing and the second sensing.

* * * * *